United States Patent
Cobbley et al.

(10) Patent No.: US 6,689,635 B1
(45) Date of Patent: Feb. 10, 2004

(54) APPARATUS AND METHOD FOR FACE-TO-FACE CONNECTION OF A DIE TO A SUBSTRATE WITH POLYMER ELECTRODES

(75) Inventors: Chad Cobbley, Boise, ID (US); Tongbi Jiang, Boise, ID (US)

(73) Assignee: Micron Technology, Inc., Bosie, ID (US)

( * ) Notice: Subject to any disclaimer, the term of this patent is extended or adjusted under 35 U.S.C. 154(b) by 0 days.

(21) Appl. No.: 09/518,339

(22) Filed: Mar. 3, 2000

Related U.S. Application Data

(62) Division of application No. 08/916,983, filed on Aug. 21, 1997, now Pat. No. 6,064,120.

(51) Int. Cl.[7] .............................................. H01L 21/44
(52) U.S. Cl. .................... 438/106; 438/613; 438/108; 438/455; 257/782
(58) Field of Search ............................... 438/106, 125, 438/108, 613, 614, 615, 455; 257/778–783

(56) References Cited

U.S. PATENT DOCUMENTS

| | | | |
|---|---|---|---|
| 3,680,198 A | * 8/1972 | Wood ..................... | 228/180.21 |
| 5,001,542 A | 3/1991 | Tsukagoshi et al. .......... | 357/68 |
| 5,074,947 A | 12/1991 | Estes et al. ................. | 156/307 |
| 5,196,371 A | 3/1993 | Kulesza et al. .............. | 437/183 |
| 5,237,130 A | 8/1993 | Kulesza et al. .............. | 174/260 |
| 5,844,320 A | 12/1998 | Ono et al. .................... | 257/778 |
| 5,854,514 A | 12/1998 | Roldan et al. ............... | 257/746 |
| 5,861,678 A | * 1/1999 | Schrock ....................... | 257/783 |
| 5,866,951 A | 2/1999 | Gademann et al. ......... | 257/783 |
| 5,897,336 A | * 4/1999 | Brouillette et al. ......... | 438/108 |
| 5,925,930 A | * 7/1999 | Farnworth et al. .......... | 257/737 |
| 5,951,893 A | * 9/1999 | Bitko et al. .................. | 219/209 |
| 6,221,691 B1 | * 4/2001 | Schrock ....................... | 438/106 |

OTHER PUBLICATIONS

Estes, R.H., "Technology Assessment: PFC Polymer Flip Chip Solderless Bump Process", *Epoxy Technology*, Technical Paper: GB–31, pp. 2–9.

Estes, R.H., et al., "Conductive Adhesive Polymer Materials in Flip Chip Applications", *Flip Chip Technologies*, Edited by John H. Lau, Chapter 6, 223–267, (1996).

* cited by examiner

Primary Examiner—George Eckert
Assistant Examiner—José R Díaz
(74) Attorney, Agent, or Firm—Schwegman, Lundberg, Woessner & Kluth, P.A.

(57) ABSTRACT

An apparatus and method for face-down connection of a die to a substrate with polymer electrodes, the method comprising forming a plurality of conductive polymer electrodes on a substrate assembly: and elevating the temperature of the die sufficiently to cause electrical and fixed connection of the die to the electrodes upon appropriate contact; and then bringing the die face and electrodes into appropriate contact thereby forming the fixed and electrical connection.

39 Claims, 5 Drawing Sheets

APPARATUS AND METHOD FOR FACE-TO-FACE CONNECTION OF A DIE TO A SUBSTRATE WITH POLYMER ELECTRODES

This application is a Divisional of U.S. Ser. No. 08/916,983, filed Aug. 21, 1997, now U.S. Pat. No. 6,064,120.

BACKGROUND OF THE INVENTION

1. Field of the Invention

This invention relates generally to electrically connecting a integrated circuit or die to a substrate. More particularly it relates to an apparatus and method for face-to-face connection of a die to a substrate with polymer electrodes.

2. Description of Related Art

From its inception the electronics industry has been driven by the demand for improved performance from both electronic components and electronic products. Every aspect of the industry is under constant scrutiny and is pressure to surpass current levels of performance. Electronic components are expected to be ever smaller, faster, lighter, more powerful and more reliable.

The integrated circuit has remained a constant target in the drive for improved performance. In response to industry demands, the integrated circuit or chip has evolved to accommodate ever more numerous electronic functions into increasingly smaller areas.

Miniaturization of computer chips has provided multiple benefits: not only have the chips become smaller and lighter, but the cost of making a chip has decreased and its performance has increased. The shrinking dimensions have reduced the time and distance of electrical signal transmission through the integrated circuit.

In addition to all of the benefits of miniaturization, new challenges and demands are also a consequence of miniaturization. Before the chip is ready to be plugged into an electronic device it must undergo further processing. In this stage of manufacturing the chip is mounted in a sturdy encasement that protects it from a variety of sources of damage and contamination. Other major functions of the encasement or electronic package include providing a path for the electrical current that powers the circuit, remove heat generated by the circuit and allow the routing of signals onto and off of the chip.

Bonding is the first step in packaging the chip. The purpose of bonding is to establish electrical connections between the chip or die and the package conductors, called leads or pins, that connect the chip to a substrate or circuit board. In concert with the shrinking size of integrated circuits their complexity has increased. This presents a problem from the perspective of packaging, because with the increased complexity of the chip there is a need for more metal conductors on the substrate, and less room available for components.

One response to such competing demands has been innovation in the methods of circuit interconnection. One method of bonding or interconnection that has addressed some of the emerging challenges is a method of attaching the active surface of the chip or die facing down, towards the substrate, this is also referred to as flip chip bonding. In face-down bonding the process that cements the die to the substrate also makes the electrical connections between the die and substrate. This face-down connection eliminates the need for long wire leads between the respective bonding pads, thereby providing desirably shorter leads. Face-to-face bonding also accommodates other desirable traits, including greater input/output, smaller device footprints and higher density.

The increasing use of face-down chip bonding has exposed both the strengths and weaknesses of the technique. Some forms of face-down chip bonding or interconnection use metal solder bumps. Some of the problems associated with the use of metal interconnections are heat stresses, from thermal coefficient of expansion mismatches, during fabrication; and the formation of electrically conductive flux between the face-down chip and the substrate. The electrically conductive flux from the melting of metal solder bumps must be removed so that the interconnection will function properly. The flux removal adds an additional and undesirable step to the bonding process.

Kulesza and Estes addressed some of these problems by eliminating the metal solder bumps and using conductive polymers in flip chip interconnections, as disclosed in their U.S. Pat. Nos. 5,074,974, 5,196,371 and 5,237,130.

Their methods teach the formation of a polymer bump on the chip and then contacting the chip to the bonding pad of the substrate. At least one disadvantage of this is requirement of the heating of the substrate or circuit board to accomplish the bonding. Since the board is made of an insulating material it is relatively more difficult and temperamental to heat than the chip, this limits the speed at which the chip can be applied.

There is still a need for methods of face-down interconnection of a chip to a substrate that are simple, reliable and cost effective.

SUMMARY OF THE INVENTION

The present invention is directed to an apparatus and method for connection of a die face to a substrate with polymer electrodes, the method comprising forming a plurality of conductive polymer electrodes on the substrate assembly; and elevating the temperature of the die sufficiently to cause electrical and fixed connection of the die to the electrodes upon appropriate contact; and bringing the die face and electrodes into appropriate contact thereby forming the fixed and electrical connection. In other embodiments the electrodes may be formed on the die face rather than the substrate assembly or the electrodes may be formed on both the die face and substrate assembly.

Additional advantages and novel features of the invention will be set forth in part in the description that follows, and in part will become apparent to those skilled in the art upon examination of the following or may be learned by practice of the invention. The advantages of the invention may be realized and attained by means of the instrumentalities and combinations particularly pointed out in the appended claims.

DETAILED DESCRIPTION

The present invention is in general terms, an apparatus and method of electrically and fixedly connecting an active face of a die and a substrate assembly, the method comprising forming a plurality of conductive polymer electrodes on the substrate assembly; and elevating the temperature of the die sufficiently to cause electrical and fixed connection of the die to the electrodes upon appropriate contact; and bringing the die face and electrodes into appropriate contact thereby forming the fixed and electrical connection.

Figure 1:
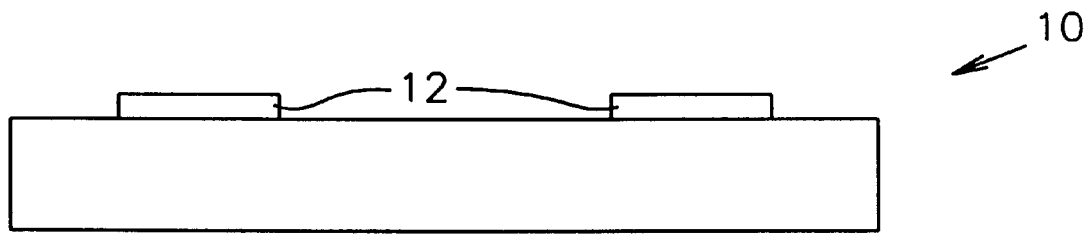
FIG. 1 is a schematic cross-section of a suitable substrate assembly in a described embodiment of the invention.

Referring to the figures, an exemplary embodiment of the present invention is described below. FIG. 1 shows a schematic cross-section of a substrate assembly 10 that can be used with the method of this invention. Substrates which can be used with this invention include circuit boards, silicon assemblies, other circuit assemblies, and the like.

An appropriately prepared substrate assembly 10 should typically have a plurality of bond pads, such as 12. It is desirable for some employments of the inventive product and method that bond pads 12 be treated with a barrier metal, for example TiW, TiN, NiCr, Pd, Au and the like.

Figure 3:
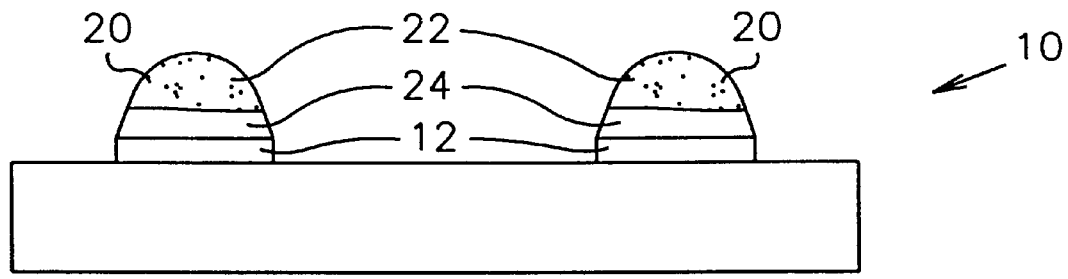
FIG. 3 is a schematic representation of an alternative formation of the conductive polymer electrodes formed on the substrate assembly shown in FIG. 1.
Figure 4:
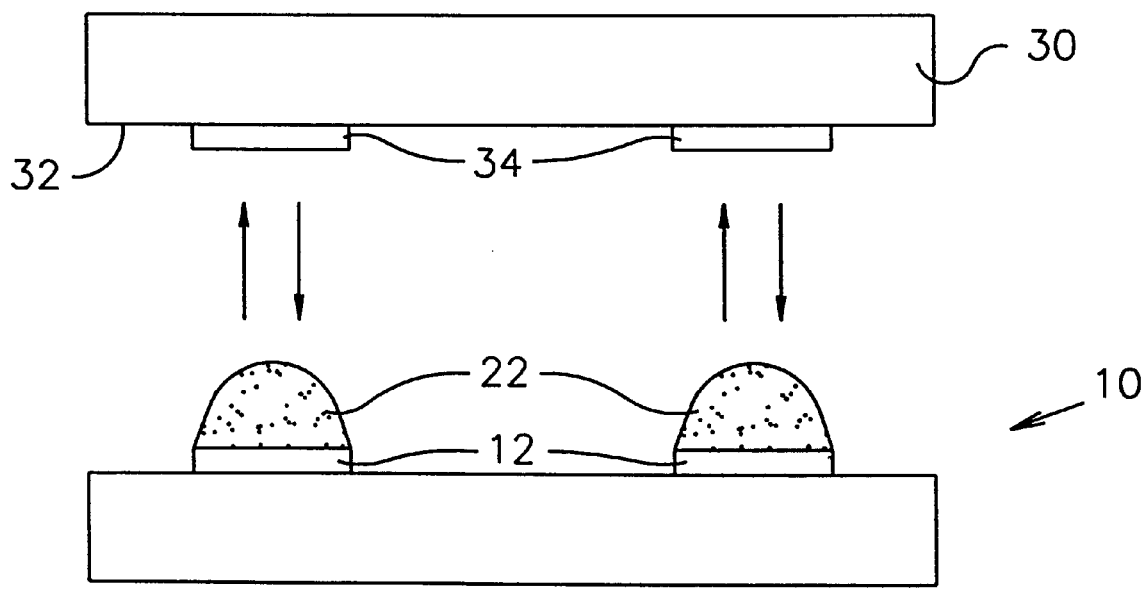
FIG. 4 is a schematic cross-section of a semiconductor die in face-down orientation, before contact with the formed conductive polymer electrodes.
Figure 9:
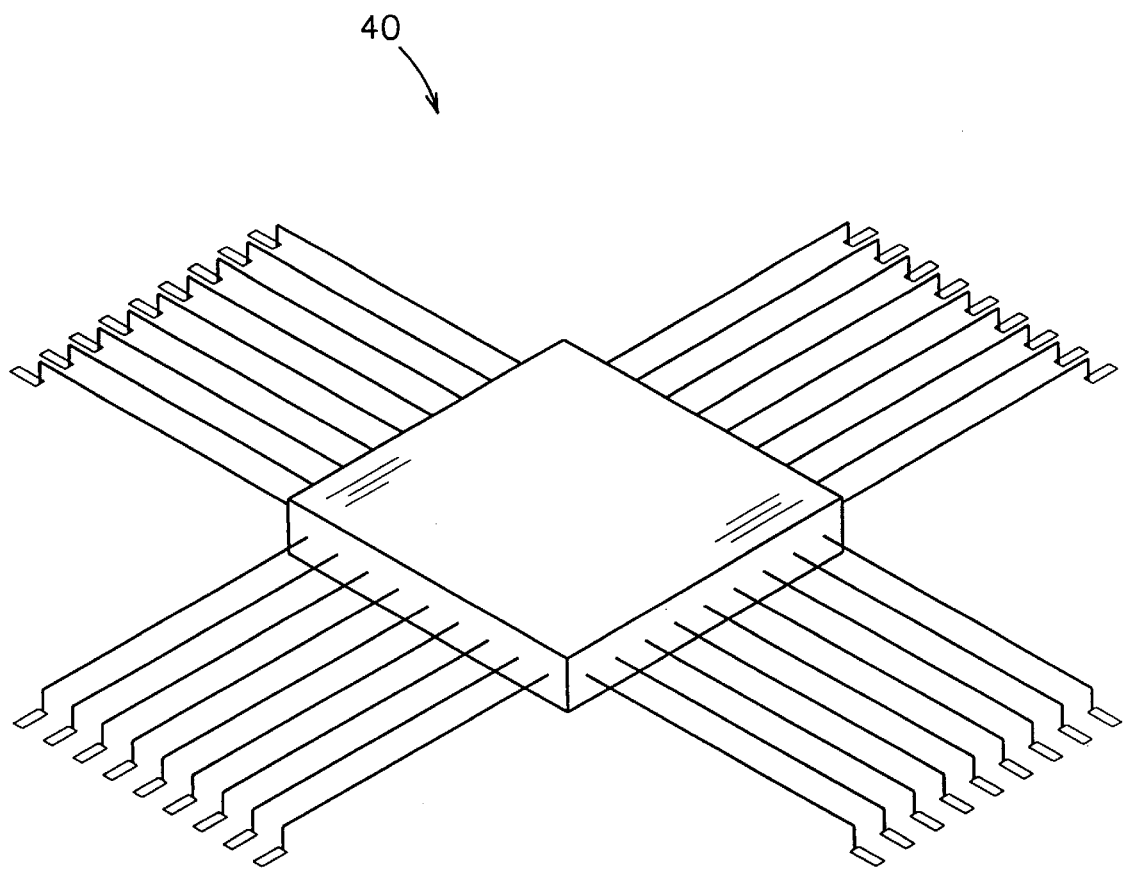
FIG. 9 is a schematic representation of an electronic device, such as would be formed in accordance with the method of this invention.

A plurality of electrodes 20 are then formed of a conductive polymer 22 on substrate bond pads 12. As shown in FIG. 3, conductive polymer 22 desirably is composed of conductive particles, to provide the conductive component, and a selected polymer. In this illustrative embodiment a silver-filled thermoplastic is used. It should be understood that other conductive materials may also be used, as desired, for example gold or nickel may be used, either alone or in combination with or without silver, as the conductive filler. The proportion of conductive filler selected in conductive polymer 22 will depend, to a large extent, upon the likely conditions and use of the resulting product as well as the desired physical properties of conductive polymer 22. Conductive polymer 22 can be designed to have selected physical and electrical properties in relation to the face-to-face method of die-to-substrate electrical interconnection set forth herein and the predicted use of the electronic device assembly 40 that results from the method. As shown in FIG. 9, important properties of conductive polymer 22 that can be selected on include, for example, electrical resistance, the polymer's tendency to associate or adhere with selected bonding pads, and viscoelasticity, particularly glass transition ($T_g$) or softening temperature.

Conductive polymer 22, in this embodiment is typically categorized as a thermoplastic. Thermoplastics are considered to be fully polymerized in their raw or ready-to-use state. That is, there is essentially no chemical reaction involved in processing thermoplastics, as they are already fully polymerized. Application of heat to thermoplastics typically results in their softening and increases their tendency to flow. During application of heat, thermoplastics can be manipulated as to form, shape, dimension and the like. Upon cooling, a thermoplastic returns to a solid state, incorporating any shape changes effected during application of heat.

The method, as described in this illustrative embodiment, includes the steps necessary for understanding and explaining the invention. Other typical fabrication processes that are necessary for the fabrication of a complete device and well known to one skilled in the art may take place sequentially before or after the present method. To avoid confusion, fabrication processes that are not essential to the present method yet might be included in the overall device fabrication, are not described herein.

Conductive polymer 22 is used to form electrodes 20 on substrate bond pads 12, through any appropriate method. It is desirable to apply conductive polymer 22 using a metal stencil. Conductive polymer 22 can also be applied using screen printing techniques, as are well known in the relevant art, or any technique that will permit conductive polymer 22 to be applied to form an electrode 20, with degree of precision acceptable for the use of resulting product.

Figure 2:
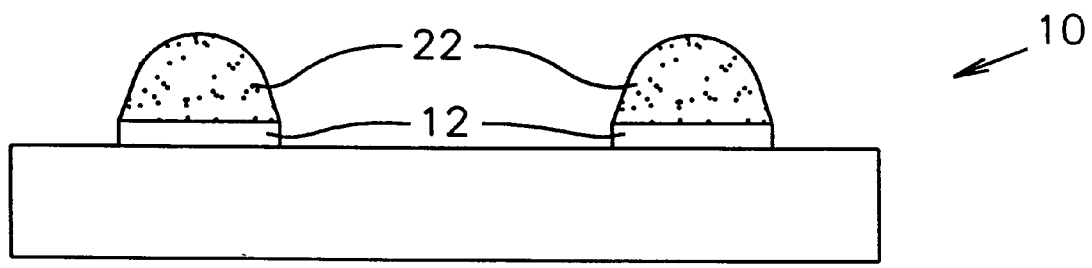
FIG. 2 is a schematic representation of the conductive polymer electrodes formed on the substrate assembly shown in FIG. 1.

Here conductive polymer 22 is applied through stencil openings of approximately 50–100 microns on to substrate bond pads 12. The height of formed electrodes 20 is, for example, 3–5 mil. Typically electrodes 20 are substantially mound or mountain shape. It is contemplated that other shapes for electrodes 20 can also be formed, for example electrodes 20 may be more raised and columnar than mound shaped in some applications. In the described embodiment electrodes 20 are formed on substrate bond pads 12 in a single deposition step, here through a stencil. Also, as described herein, electrodes 20 are single layer in nature, that is substantially uniform in their composition throughout the entirety of each electrode 20 and substantially non-stratified. As shown in FIG. 2, it is contemplated that electrodes 20 could also be formed as polylayers, for example, with thermoset polymer, which could act as a spacer, applied on to substrate bond pads 12. In the case of the polylayer example, electrode 20 would then be formed on top of a thermoset polymer, here layer 24, as shown in FIG. 3.

Figure 6:
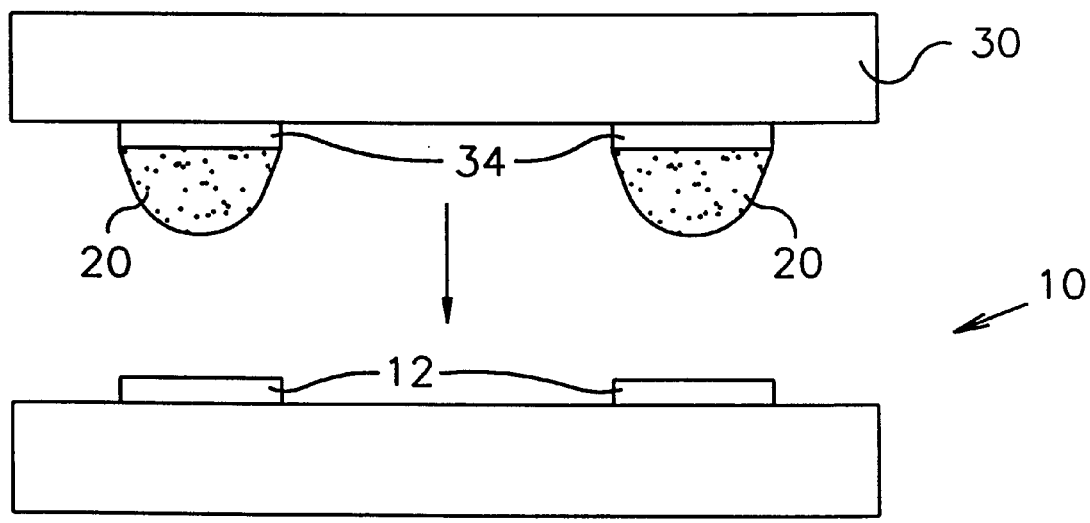
FIG. 6 is a schematic cross-section of the conductive polymer electrodes formed on the face of die.
Figure 7:
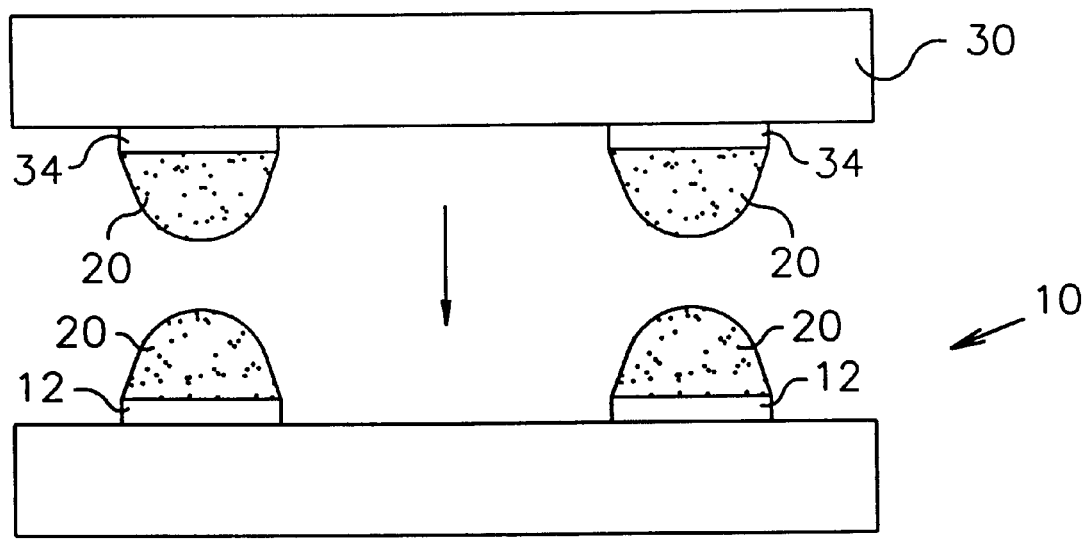
FIG. 7 is a schematic cross-section of the conductive polymers formed on both the substrate assembly and the die.

It is also taken it to account that for some applications electrodes 20 could be alternatively formed on face 32 of die 30 rather than on the face of substrate assembly 10, as seen in FIG. 6, or conductive polymer electrodes 20 might desirably be formed on the face of both substrate assembly 10 and die face 32, as shown in FIG. 7.

Figure 8:
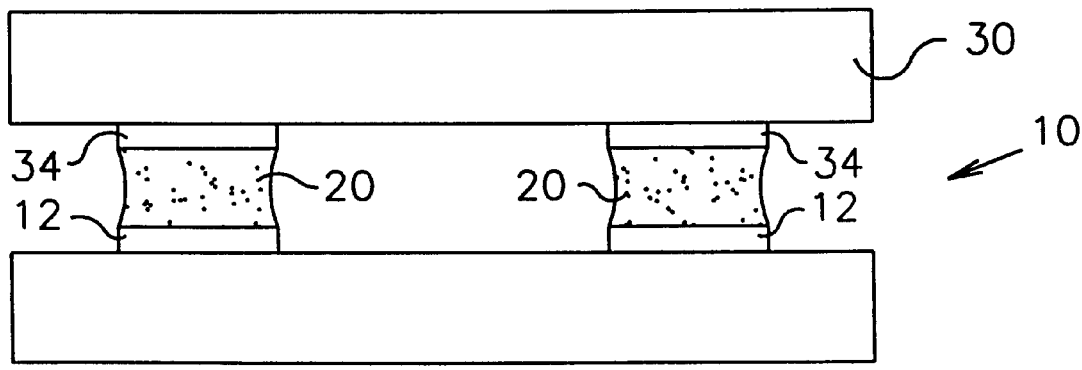
FIG. 8 is a schematic cross-section of a semiconductor die after contact with the formed conductive polymer electrodes of FIG. 2.

After the formation of electrodes 20 on substrate assembly 10, a die or integrated circuit chip 30 is then brought into appropriate contact with electrodes 20 to form an electronic assembly device 40, with fixed and electrical interconnection between die 30 and substrate assembly 10 as shown in FIGS. 8 and 9.

In this embodiment die 30 is heated to elevate the temperature of die 30 to be higher than the $T_g$ of conductive polymer 22. Here die 30 is heated to a temperature of approximately 160° centigrade (C). Typically the temperature range that die 30 should be elevated to is approximately 50° to 180° C. The elevating of the temperature of die 30 prior to contact with electrodes 20 promotes a better physical association and connection between die 30 and electrodes 20, and hence a better electrical connection between die 30 and substrate assembly 10. Typically die 30 is brought into contact with electrodes 20 under the guidance of dedicated equipment for alignment and bonding of face-down, die-to-substrate assemblies. One example of a suitable device would be the RDI model M8A, manufactured by RDI (New Jersey).

Die 30 should be appropriately prepared, as dictated by its predicted use. Typically face 32 of die 30 will be passivated, as is well known in the art, with die bond pads 34 left exposed. It is contemplated that for some embodiments one or more optional, additional layers may be formed on face 32 of die 30 and/or substrate 10.

Figure 5:
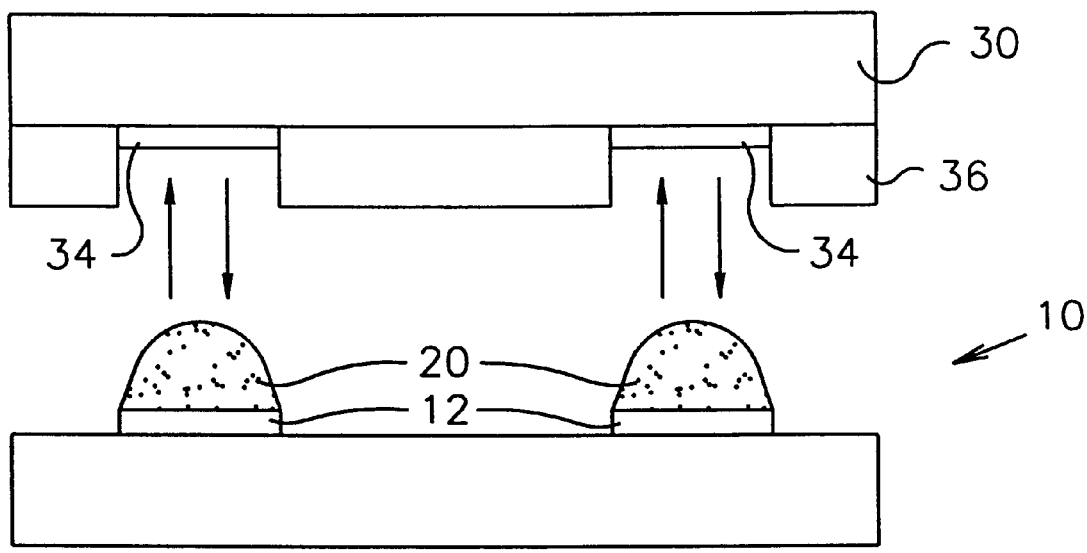
FIG. 5 is a schematic cross-section of an alternatively prepared semiconductor die in face-down orientation, before contact with the formed conductive polymer electrodes.

In another embodiment it is envisioned that passivation layer 36 on die 30 may surround die bond pads 34 in an elevated fashion, such that die bond pads 34 are physically defined as wells or recesses in face 32 of die 30, as can be seen in FIG. 5. The amount of pressure under which die face 32 and electrodes 20 are brought into contact will be driven by the materials selected. Here, die face 32 and electrodes 20 are brought into contact by bonding pressures between approximately [99–130 psi] 70 to 90 g/cm$^2$. The temperature to which die 30 is elevated and the amount of bonding pressure applied should be appropriate and sufficient to form a fixed and electrical interconnection between die face 32, electrodes 20 and substrate assembly 10.

Optionally, after the face-down electrical connection of die 30 to substrate 10, the space between die 30 and substrate assembly 10 can be underfilled with an encapsulant, as is well known in the art. It is desirable to avoid using an underfill encapsulant, but the decision is generally made based on the likely device use and dimension.

The process of this invention elevates the temperature of die 30 only. This supplies many advantages, including introducing less heat into substrate assembly 10, which is typically far more susceptible to heat stresses and intolerance than die 30. This process is also comparatively fast, allowing more rapid application of die 30 to substrate 10 in a face-down interconnection. This method requires no post processing, such as typical batch curing. This process is relatively faster and simpler than existing similar methods and is therefore more desirable and useful for many applications.

The invention has been described in the environment of a single die on a substrate assembly. This environment was chosen for illustration purpose only, to further the understanding of the invention. It will be apparent to one skilled in the relevant art, for example, that the invention can be used with a variety of integrated circuits, chips, electrode materials and substrates. It will therefore be understood that modifications and variations are possible without departing from the scope of the invention as expressed in the following claims.

We claim:

1. A method of electrically and fixedly connecting an active face of a die and a substrate assembly, the method comprising providing a die having an active face free of polymer electrode mounds and a substrate assembly; forming a plurality of conductive polymer electrode mounds on the substrate assembly; elevating the temperature of only the die to above about 50° C. to cause electrical and fixed connection of the die to the mounds upon appropriate contact with the mounds; and bringing the die face and mounds into appropriate contact thereby forming fixed and electrical connection with the substrate assembly being independent of heat-stressed defects.

2. The method of claim 1 wherein the electrodes are single layers.

3. The method of claim 1 further comprising forming the electrodes in a single deposition.

4. A method of electrically and fixedly connecting an active face of a die and a substrate assembly, the method comprising providing a die having an active face and a substrate assembly; forming a plurality of conductive polymer electrode mounds on the die face; elevating the temperature of only the die to the range of about 50° C. to about 180° C. to cause electrical and fixed connection of the substrate assembly to the mounds upon appropriate contact between the mounds and the substrate assembly; and bringing the die face and mounds into appropriate contact thereby forming fixed and electrical connection with the substrate assembly being independent of heat-stressed defects.

5. A method of electrically and fixedly connecting an active face of a die and a substrate assembly, the method comprising providing a die having an active face and a substrate assembly; forming a plurality of conductive polymer electrode mounds on the substrate assembly and the die face; elevating the temperature of only the die to the range of about 50° C. to about 180° C. to cause electrical and fixed connection between the formed electrodes on the die and the formed electrodes on the substrate assembly upon appropriate contact between them; and bringing the die face with electrode mounds and substrate assembly with electrode mounds into appropriate contact, thereby forming fixed and electrical connection with the substrate assembly being independent of heat-stressed defects.

6. A method of forming an electrical connection between an active face of a die and a substrate assembly, the method comprising:

providing a die having an active face and a substrate assembly, the substrate assembly being independent of heat-stressed defects, the active face free of electrode mounds; and forming a plurality of raised electrodes on the substrate assembly, wherein the electrodes are formed in a single deposition of an electrically conductive polymer and bringing the face of the die and the mounds in appropriate contact to form an electrical connection between the die and the substrate assembly after heating only the die to a temperature above about 50° C., the electrically conductive polymer comprising a thermoplastic.

7. The method of claim 6 wherein the electrodes are single layers.

8. The method of claim 6 wherein the conductive polymer is a thermoplastic filled with a metal selected from the group consisting of Ag, Au and Ni.

9. The method of claim 6 wherein the conductive polymer is silver filled thermoplastic.

10. The method of claim 6 wherein the substrate includes a barrier metal selected from the group consisting of TiW, TiN, NiCr, Pd and Au.

11. The method of claim 6 wherein the substrate assembly includes a plurality of thermoset polylayer mounds formed thereon, on which the plurality of electrodes are formed.

12. A method of forming a face-to-face electrical interconnection between a die and a substrate assembly, the method comprising:

providing an appropriately prepared substrate assembly with electrically conductive polymer electrodes of predetermined size and location on the substrate face, the substrate assembly being independent of heat-stressed defects; and bringing the face of an appropriately prepared die in contact with the electrodes after elevating the temperature of only the die to above about 50° C. to form a functional electrical interconnection, the electrically conductive polymer electrodes comprising a thermoplastic, the face of the appropriately prepared die being free of electrode mounds.

13. The method of claim 12 wherein the electrodes are single layers.

14. The method of claim 12 further comprising forming the electrodes in a single deposition.

15. The method of claim 12 wherein the conductive polymer is a thermoplastic filled with a metal selected from the group consisting of Ag, Au and Ni.

16. The method of claim 12 wherein the conductive polymer is silver filled thermoplastic.

17. The method of claim 12 wherein the substrate includes a barrier metal selected from the group consisting of TiW, TiN, NiCr, Pd and Au.

18. The method of claim 12 wherein the substrate assembly includes a plurality of thermoset polylayer mounds formed thereon, on which the plurality of electrodes are formed.

19. A method of forming an electrical connection between an active face of a die and a substrate assembly, the method comprising:

providing a substrate assembly with a plurality of exposed bonding pads thereon;

providing an appropriately prepared die having a plurality of exposed bonding pads on the die face, the plurality of exposed bonding pads being free of conductive polymer electrodes;

forming a plurality of electrically conductive polymer electrodes on the bonding pads of the substrate assembly;

heating the die to a temperature above about 50° C. to cause fixed and electrical connection with the electrodes, wherein only the die is heated to prevent heat-stressed defects in the substrate assembly;

mating the bonding pads on the face of the heated die with the electrodes sufficiently to form an electrical connection.

20. The method of claim 19 wherein the electrodes are single layers.

21. The method of claim 19 further comprising forming the electrodes in a single deposition.

22. A method of forming a face-down electrical interconnection between a die and a substrate assembly, the method comprising:

providing an appropriately prepared substrate assembly with a plurality of raised electrically conductive polymer electrodes of predetermined size and location on the substrate; heating only a die with recessed bond pads on the die face to prevent heat-stressed defects in the substrate assembly, wherein the recessed bond pads, which are free of electrodes, correspond to the raised electrodes on the substrate assembly; and contacting the die bond pads and electrodes sufficiently to form an electrical interconnection.

23. The method of claim 22 wherein the electrodes are single layers.

24. The method of claim 22 further comprising forming the electrodes in a single deposition.

25. A method of forming an electrical connection between an active face of a die and a substrate assembly, the method comprising:

providing a die having an active face and a substrate assembly, the substrate assembly being independent of heat-stressed defects, the active face being free of electrode mounds; and forming a plurality of raised electrode mounds on the substrate assembly, wherein the electrode mounds are formed in a single deposition of an electrically conductive polymer and bringing the face of the die and the electrode mounds in appropriate contact to form an electrical connection between the die and the substrate assembly, and wherein only the die is heated before contact with the electrode mounds to a temperature above about 50° C. to prevent any heat-stressed defects in the substrate assembly.

26. The method of claim 25 wherein the electrodes are single layers.

27. The method of claim 25 wherein the electrically conductive layer comprises a thermoplastic.

28. The method of claim 25 wherein the conductive polymer is a thermoplastic filled with a metal selected from the group consisting of Ag, Au and Ni.

29. The method of claim 25 wherein the conductive polymer is silver filled thermoplastic.

30. The method of claim 25 wherein the substrate includes a barrier metal selected from the group consisting of TiW, TiN, NiCr, Pd and Au.

31. The method of claim 25 wherein the substrate assembly includes a plurality of thermoset polylayer mounds formed thereon, on which the plurality of electrodes are formed.

32. A method of forming a face-to-face electrical interconnection between a die and a substrate assembly, the method comprising:

providing an appropriately prepared substrate assembly with electrically conductive polymer electrodes of predetermined size and location on the substrate face; and bringing the face of an appropriately prepared die in contact with the electrodes, thereby forming a functional electrical interconnection, wherein only the die is heated before contact with the electrodes to a temperature above about 50° C. to prevent heat-stress defects in the substrate assembly; and wherein the face of the appropriately prepared die is free of conductive polymer electrodes.

33. The method of claim 32 further comprising forming the electrodes in a single deposition.

34. The method of claim 32 wherein the electrodes are single layers.

35. The method of claim 32 wherein the electrically conductive layer comprises a thermoplastic.

36. The method of claim 32 wherein the conductive polymer is a thermoplastic filled with a metal selected from the group consisting of Ag, Au and Ni.

37. The method of claim 32 wherein the conductive polymer is silver filled thermoplastic.

38. The method of claim 32 wherein the substrate includes a barrier metal selected from the group consisting of TiW, TiN, NiCr, Pd and Au.

39. The method of claim 32 wherein the substrate assembly includes a plurality of thermoset polylayer mounds formed thereon, on which the plurality of electrodes are formed.

* * * * *